(12) United States Patent
Feiweier

(10) Patent No.: US 12,320,881 B2
(45) Date of Patent: Jun. 3, 2025

(54) METHOD FOR THE OPTIMIZED ACQUISITION OF DIFFUSION-WEIGHTED MEASUREMENT DATA OF AN OBJECT UNDER EXAMINATION BY A MAGNETIC RESONANCE SYSTEM

(71) Applicant: Siemens Healthcare GmbH, Erlangen (DE)

(72) Inventor: Thorsten Feiweier, Bavaria (DE)

(73) Assignee: Siemens Healthineers AG, Erlangen (DE)

( * ) Notice: Subject to any disclaimer, the term of this patent is extended or adjusted under 35 U.S.C. 154(b) by 95 days.

(21) Appl. No.: 18/115,885

(22) Filed: Mar. 1, 2023

(65) Prior Publication Data

US 2023/0280432 A1 Sep. 7, 2023

(30) Foreign Application Priority Data

Mar. 1, 2022 (DE) .................... 10 2022 202 093.6

(51) Int. Cl.
 *G01R 33/56* (2006.01)
 *G01R 33/561* (2006.01)
 *G01R 33/563* (2006.01)

(52) U.S. Cl.
 CPC ... *G01R 33/56341* (2013.01); *G01R 33/5608* (2013.01); *G01R 33/5616* (2013.01)

(58) Field of Classification Search
 CPC .......... G01R 33/56341; G01R 33/5608; G01R 33/5616
 See application file for complete search history.

(56) References Cited

U.S. PATENT DOCUMENTS

2007/0052417 A1 3/2007 Zhang et al.
2009/0240379 A1 9/2009 Feiweier
(Continued)

FOREIGN PATENT DOCUMENTS

DE 102008015261 B4 11/2009
DE 102009049402 A1 5/2011
(Continued)

OTHER PUBLICATIONS

Setsompop K. et al., "Improving Diffusion MRI Using Simultaneous Multi-Slice Echo Planar Imaging;" Neuroimage; doi:10.1016/j.neuroimage.2012.06.033; Oct. 15, 2012 (Oct. 15, 2012).
(Continued)

*Primary Examiner* — G. M. A Hyder
(74) *Attorney, Agent, or Firm* — Banner Witcoff Ltd.

(57) ABSTRACT

In a method for the optimized acquisition of diffusion-weighted measurement data of an object under examination using a magnetic resonance (MR) system, a first set of diffusion-weighted measurement data is captured by excitation, and, in an acquisition phase, acquisition of at least one position-encoded echo signal, where prior to the acquisition phase, diffusion gradients are switched for diffusion encoding of the diffusion-weighted measurement data in a diffusion preparation phase, and at least one further set of diffusion-weighted measurement data is captured by excitation, and, in an acquisition phase, acquisition of at least one further position-encoded echo signal, where prior to the acquisition phase, diffusion gradients are switched for diffusion encoding of the diffusion-weighted measurement data in the associated diffusion preparation phase. The diffusion gradients switched in consecutive diffusion preparation phases may have an inverted polarity.

21 Claims, 3 Drawing Sheets

(56) References Cited

U.S. PATENT DOCUMENTS

| | | | |
|---|---|---|---|
| 2011/0085722 A1* | 4/2011 | Feiweier | G01R 33/56518 |
| | | | 324/309 |
| 2011/0187367 A1 | 8/2011 | Feiweier et al. | |
| 2011/0241679 A1 | 10/2011 | Feiweier et al. | |
| 2018/0284211 A1 | 10/2018 | Li et al. | |
| 2019/0011518 A1 | 1/2019 | Feiweier | |
| 2020/0150161 A1 | 5/2020 | Feiweier et al. | |

FOREIGN PATENT DOCUMENTS

| | | |
|---|---|---|
| DE | 10201001577 B4 | 3/2012 |
| DE | 102010013605 B4 | 3/2013 |
| EP | 3425417 A1 | 1/2019 |
| EP | 3654050 A1 | 5/2020 |

OTHER PUBLICATIONS

Reese T.G., "Reduction of Eddy-Current-Induced Distortion in Diffusion MRI Using a Twice-Refocused Spin Echo," Magnetic Resonance in Medicine, vol. 49, pp. 177-182; 2003.
Stejskal E.O. et al., "Spin Diffusion Measurements: Spin Echoes in the Presence of a Time-Dependent Field Gradient," The J.Chem. Phys. 42:288-292; 1965.

* cited by examiner

METHOD FOR THE OPTIMIZED ACQUISITION OF DIFFUSION-WEIGHTED MEASUREMENT DATA OF AN OBJECT UNDER EXAMINATION BY A MAGNETIC RESONANCE SYSTEM

CROSS REFERENCE TO RELATED APPLICATIONS

This patent application claims priority to German Patent Application No. 10 2022 202 093.6, filed Mar. 1, 2022, which is incorporated herein by reference in its entirety.

BACKGROUND

Field

The disclosure relates to a method for the optimized acquisition of diffusion-weighted measurement data of an object under examination by means of a magnetic resonance (MR) system.

Related Art

Magnetic resonance (MR) technology is a known technology with which images of the interior of an object under examination can be generated. In simplified terms, for this purpose the object under examination is positioned in a magnetic resonance device in a comparatively strong static, homogeneous constant magnetic field, also called a $B_0$ field, with field strengths from 0.2 tesla to 7 tesla and more, so that its nuclear spins are oriented along the constant magnetic field. To trigger nuclear spin resonances measurable as signals, radio-frequency excitation pulses (RF pulses) are irradiated into the object under examination, the triggered nuclear spin resonances are measured as so-called k-space data and on the basis thereof MR images are reconstructed or spectroscopy data is determined. For position encoding of the measurement data, the constant magnetic field is overlaid by rapidly switched magnetic gradient fields, called gradients for short. A diagram used, which describes a temporal sequence of RF pulses to be irradiated and gradients to be switched, is referred to as a pulse sequence (diagram), or also for short as a sequence. The plotted measurement data is digitalized and stored as complex numerical values in a k-space matrix. An associated MR image can be reconstructed from the k-space matrix populated with values, for example by means of a multidimensional Fourier transform.

Normally a magnetic resonance acquisition consists of a plurality of individual partial measurements, in which raw data is acquired from different slices of the object under examination, in order then to reconstruct volume image data therefrom.

Additionally, however, it is also necessary in many examinations to perform multiple, i.e. a whole series of, magnetic resonance acquisitions of the object under examination, wherein a particular measurement parameter is varied. Using the measurements, the effect of this measurement parameter on the object under examination is observed, in order then subsequently to draw diagnostic conclusions therefrom. A series in this case means at least two, but generally more than two, magnetic resonance acquisitions. In this case a measurement parameter is usefully varied, such that the contrast of a particular material type excited during the measurements, for example of a tissue type of the object under examination or of a chemical substance which is significant for most or particular tissue types, such as water for example, is influenced as strongly as possible by the variation of the measurement parameter. This ensures that the effect of the measurement parameter on the object under examination is particularly readily apparent.

A typical example of series of magnetic resonance acquisitions with variation of a measurement parameter strongly influencing the contrast are what are known as diffusion weighting imaging (DWI) methods. Diffusion means the Brownian motion of molecules in a medium. In diffusion imaging multiple images with different diffusion directions and weightings are generally acquired and combined with one another. The strength of the diffusion weighting is mostly defined by what is known as the "b-value". The diffusion images with different diffusion directions and weightings or the images combined therefrom can then be used for diagnostic purposes. Thus, by using suitable combinations of the acquired diffusion-weighted images, parameter maps with particular diagnostic predictive force can be generated, such as for example maps which reproduce the "Apparent Diffusion Coefficient (ADC)" or the "Fractional Anisotropy (FA)". Diffusion imaging is frequently based on echo planar imaging (EPI) because of the short acquisition time of the EPI sequence per image and its robustness against movement.

In diffusion-weighted imaging, additional gradients, which reflect the diffusion direction and weighting, are inserted into a pulse sequence, in order to make the diffusion properties of the tissue apparent or to measure them. The result of these gradients is that tissue with rapid diffusion (cerebrospinal fluid (CSF), for example) is subject to a stronger signal loss than tissue with slow diffusion (the gray matter in the brain, for example). The resultant diffusion contrast is becoming clinically of ever greater significance and applications now extend well beyond the traditional early recognition of ischemic stroke.

Thus, MR diffusion imaging provides both clinical diagnostics and basic medical research with an important method for making microstructural properties and changes in biological tissue apparent. With the increasing complexity of the underlying modeling the need for data to be acquired—for example acquisitions with a plurality of different diffusion encodings (weightings, directions, temporal operational sequences, etc.)—and thus the need to speed up the measurements, in order to be able to acquire all desired data in a time span that is acceptable, for clinical operational sequences for example, is increasing.

Methods for speeding up MR acquisition techniques such as parallel imaging (PAT), compressed sensing (CS), deep learning (DL) or simultaneous multi-slice imaging (SMS), are already known, these for example reducing the amount of measurement data to be acquired and thus the time needed for the acquisition of the measurement data.

Despite the introduction of such acceleration techniques, the acquisition times for many DWI measurements are still in the order of several minutes, so that every approach to further reducing measurement times—ideally in combination with at least one of the aforementioned acceleration techniques—is of significance.

During an acquisition of measurement data using magnetic resonance, certain limitations of the hardware used in the magnetic resonance system can result in a restriction of the extent to which a reduction in the overall measurement time of the desired measurement data can be achieved. For example, the power electronics used, in particular the gradient power amplifiers (GPA) used, can limit a desired reduction in an overall measurement time because of the presence of an inherent load limit, for example because a sequence of diffusion gradients with, as with diffusion encoding, a high amplitude can be performed on an identical physical gradient axis only with additional pauses between the gradients to be switched, and thus with an extended time of repetition TR of the acquisition sequence.

To this end it is for example already known from DE102008015261B4, for a check to be made on the executability of a measurement sequence to be performed by determining a load curve.

A method for optimizing a temporal sequence of sequence modules of an MR control sequence, aimed at achieving a maximally uniform distribution of the load on the hardware components over the course of the MR control sequence and at preventing brief power peaks is known from EP3425417A1. In this case in particular hardware components with long thermal time constants are taken into consideration. No optimization within the sequence modules takes place. A further method for taking account of load curves of hardware components with long thermal time constants is known from EP3654050A1.

US2018/0284211A1 describes an MR DWI method in which in consecutive times of repetition TR diffusion gradients are applied in different directions. In this case maximally different, for example orthogonal, directions for the diffusion gradients of consecutive times of repetition TR are used in order to relieve the load on individual axes of the gradient system. However, an approach such as this means that different sequences of diffusion gradients are used for different acquired slices in each case. This in turn results in each case in differently occurring eddy-current effects generated by the different sequences of diffusion gradients for each slice acquired. As a result, artifacts, in particular distortions, can occur between the slices acquired.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
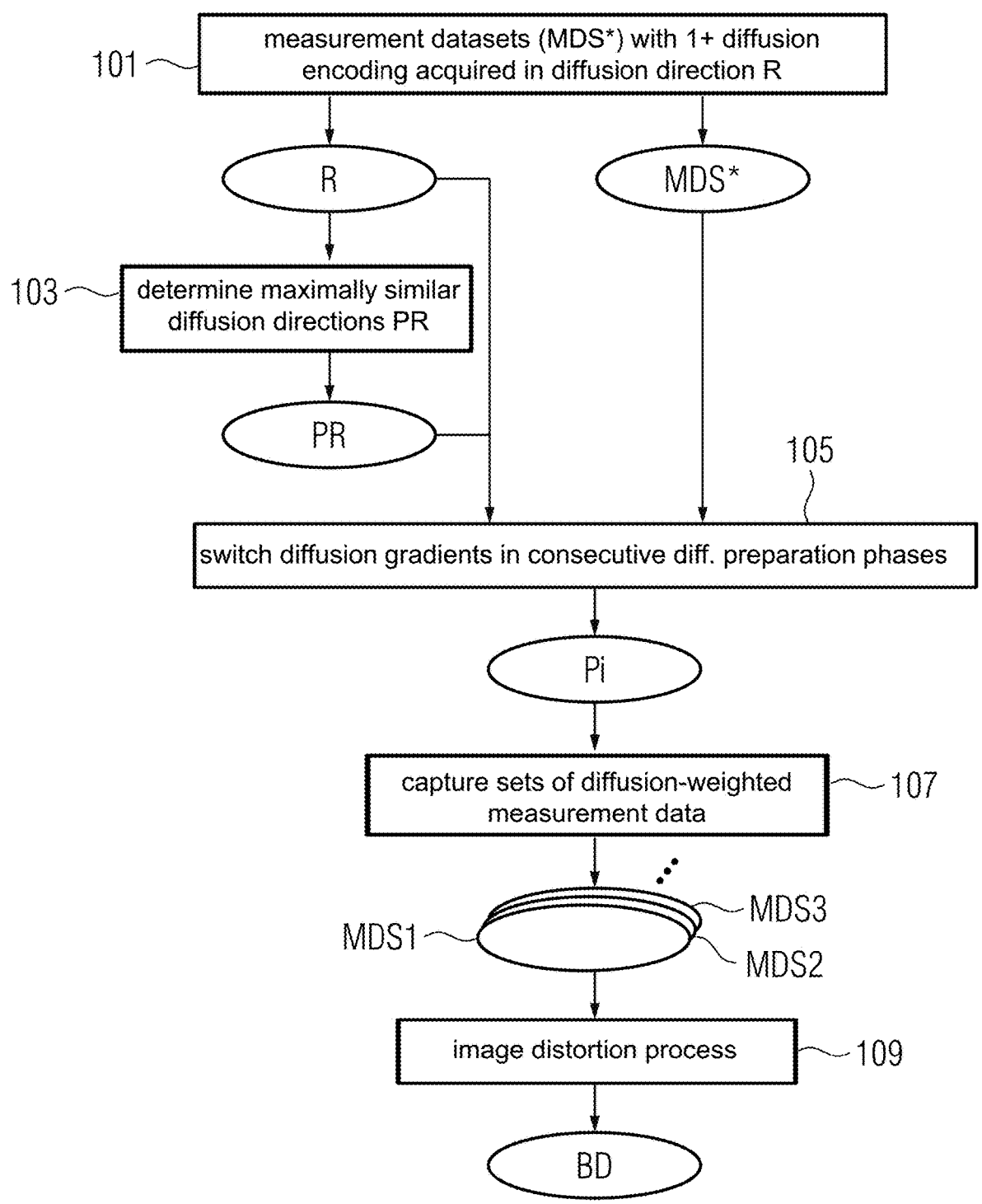
FIG. 1 is a flowchart of a method according to an exemplary embodiment of the present disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to enable a reduction in the overall measurement time for an acquisition of a desired set of diffusion-weighted measurement data while at the same time preventing artifacts caused by eddy currents.

The object is achieved by a method for the optimized acquisition of diffusion-weighted measurement data of an object under examination by means of a magnetic resonance system, a magnetic resonance system, a computer program, and an electronically readable data medium, according to exemplary embodiments of the disclosure.

The disclosure is based on the consideration that a short-term load on power electronics, in particular a GPA, of a magnetic resonance system depends not only on the physical axis of a gradient to be switched (the x, y and/or z axis of a GPA assigned to the gradient), but also on the polarity of the gradient to be switched, since different components are generally responsible for the generation of gradients with "negative" or "positive" polarity within a GPA module assigned to a physical axis. At the same time, the polarity of the diffusion gradients used is irrelevant for the diffusion contrast achieved.

A method for the optimized acquisition of diffusion-weighted measurement data of an object under examination by means of a magnetic resonance system, according to an exemplary embodiment, may include the operations:

capture of a first set of diffusion-weighted measurement data by excitation and in an acquisition phase acquisition of at least one position-encoded echo signal, wherein prior to the acquisition phase diffusion gradients are switched for the diffusion encoding of the measurement data in a diffusion preparation phase, and capture of at least one further set of diffusion-weighted measurement data by excitation and in an acquisition phase acquisition of at least one further position-encoded echo signal, wherein prior to the acquisition phase diffusion gradients are switched for the diffusion encoding of the measurement data in the associated diffusion preparation phase, wherein diffusion gradients switched in consecutive diffusion preparation phases have an inverted polarity.

Thanks to the inventive procedure, in accordance with which a diffusion gradient of a diffusion preparation phase and a diffusion gradient, corresponding to the diffusion gradient of the diffusion preparation phase, of a diffusion preparation phase following on from the diffusion preparation phase have different polarities, a diffusion encoding takes place in consecutive diffusion preparation phases in maximally antiparallel diffusion directions.

As a result, a load on polarity-sensitive hardware components, in particular GPAs, is reduced to short time scales, meaning that in turn rest times (measurement pauses) that would otherwise be necessary can be reduced or even eliminated entirely. Thus, an overall measurement time required for the acquisition of all desired measurement data can be reduced, since a sequence of diffusion gradients can be applied with an alternating polarity in accordance with the disclosure in a shorter time interval than a sequence of diffusion gradients with an identical pulse shape, but also in each case an identical polarity.

In addition, eddy-current fields, which are induced by switched gradients with a similar direction, but different polarity, have a similar spatial structure but with inverted signs. An alternating sequence of such gradients thus results, assuming eddy-current time constants which are at least in the order of magnitude of the temporal sequence, in an at least partial compensation of eddy-current fields. Thus, artifacts caused by eddy currents can be prevented.

A magnetic resonance system according to an exemplary embodiment may include a magnet unit, a gradient unit, a radio-frequency unit and a controller configured to perform an inventive method with a polarization determination unit.

An inventive computer program implements an inventive method on a controller when it is executed on the controller.

The computer program can also be present here in the form of a computer program product that can be loaded directly into a memory of a controller, with program code means to execute an inventive method when the computer program product is executed in the computing unit (e.g. processor) of the computing system.

An inventive electronically readable data medium comprises electronically readable control information stored thereon, which comprises at least one inventive computer program and is designed such that when the data medium is used in a controller of a magnetic resonance system it performs an inventive method.

The advantages and explanations specified in respect of the method also apply analogously for the magnetic resonance system, the computer program product and the electronically readable data medium.

FIG. 1 is a schematic flow diagram of an inventive method for the optimized acquisition of diffusion-weighted measurement data of an object under examination by means of a magnetic resonance system.

For the acquisition of diffusion-weighted measurement data a diffusion preparation is undertaken, in which diffusion gradients are switched.

Figure 2:
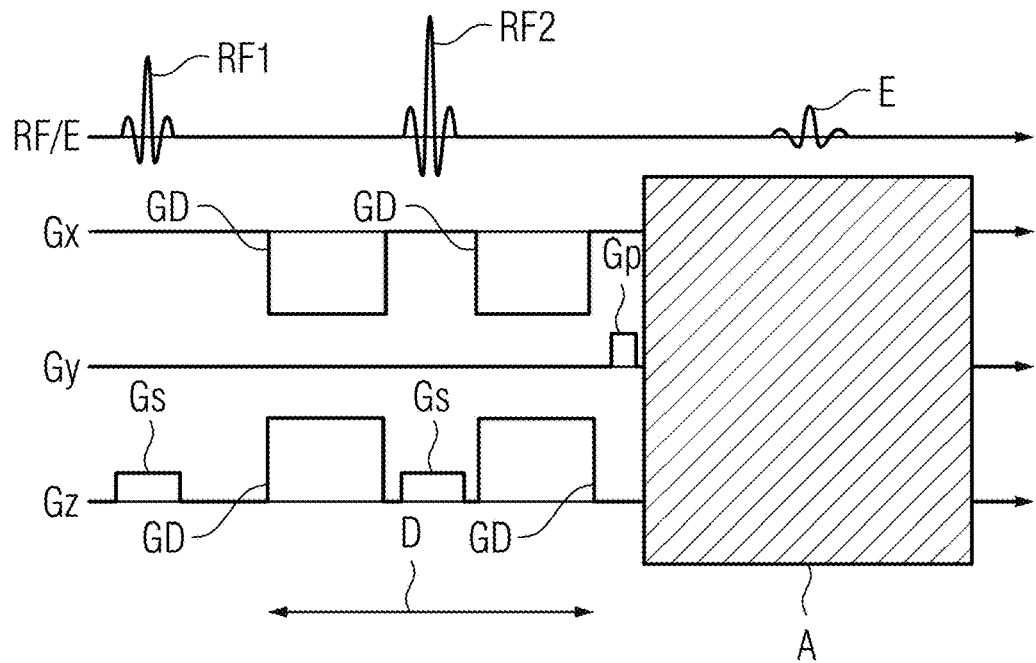
FIG. 2 is a plot of a pulse sequence diagram for the clarification of a diffusion preparation, according to an exemplary embodiment of the present disclosure.

FIG. 2 is a schematically represented pulse sequence diagram which illustrates a temporal sequence of RF pulses to be irradiated and gradients to be switched, and in which a diffusion preparation is to be briefly explained in principle.

Shown in the top row by way of example are RF pulses to be irradiated and echo signals E generated, which are acquired as measurement data. The next three rows show examples of the gradients to be switched in the three physical spatial directions x, y and z. In principle an echo signal E is excited by means of an RF excitation pulse RF1, and is captured as measurement data in an acquisition phase A. Should a spin echo be generated as an echo signal E, a refocusing pulse RF2 can be irradiated between the RF excitation pulse RF1 and the echo signal E to be generated. For position encoding of the captured measurement data, slice selection gradients Gs, which limit the effect of a simultaneously irradiated RF pulse for example to a desired slice of the object under examination, and phase encoding gradients Gp can be switched prior to the acquisition phase A. During the acquisition phase A further readout gradients (not shown) can be switched in a known manner for encoding in acquisition direction x depending on the acquisition technique used, for example with an echoplanar acquisition technique (EPI). Further gradients, for example for the rephasing of spins or for spoiling undesired signal portions, can be switched in a known manner.

For diffusion encoding, diffusion gradients GD are switched after the RF excitation pulse RF1 and prior to the acquisition phase A in a diffusion preparation phase D. In the example shown the diffusion encoding is achieved with a monopolar diffusion encoding diagram as described for example by Stejskal and Tanner in "Spin Diffusion Measurements: Spin Echoes in the Presence of a Time-Dependent Field Gradient", J. Chem. Phys. 42:p. 288-292 (1965).

As already mentioned, in a diffusion imaging method a series of desired measurement datasets MDS* with at least one diffusion encoding is acquired in at least one desired diffusion direction R (Block 101). The diffusion directions R for which diffusion-weighted measurement data is to be acquired, and the desired measurement datasets MDS* which inter alia can also stipulate a desired position encoding and a frequency of the acquisition of desired measurement data with the desired diffusion encodings, can be loaded into a control unit of a magnetic resonance system.

In accordance with the disclosure, a first set of diffusion-weighted measurement data MDS1 is captured by excitation and in an acquisition phase A acquisition of at least one position-encoded echo signal, wherein prior to the acquisition phase A in a diffusion preparation phase D diffusion gradients are switched for the diffusion encoding of the measurement data, and at least one further set MDS2, MSD3, . . . of diffusion-weighted measurement data is captured by excitation and in an acquisition phase A acquisition of at least one further position-encoded echo signal, wherein prior to the acquisition phase A in the associated diffusion preparation phase D diffusion gradients for the diffusion encoding of the measurement data are switched (Block 107).

It is thereby ensured that diffusion gradients switched in consecutive diffusion preparation phases have an inverted polarity (Block 105), i.e. a diffusion gradient of a diffusion preparation phase and a diffusion gradient, corresponding to the diffusion gradient of the diffusion preparation phase, of a diffusion preparation phase following on from the diffusion preparation phase have different polarities $P_i$, so that in consecutive diffusion preparation phases a diffusion encoding takes place in maximally antiparallel diffusion directions. To this end a respective polarity of a diffusion gradient to be switched corresponding to the polarity of the diffusion gradient of a preceding diffusion preparation phase can easily be adjusted, since, as already mentioned above, the polarity of the diffusion gradients is irrelevant for the diffusion encoding achieved.

The first set of diffusion-weighted measurement data MDS1 can comprise measurement data of a first slice of the examined object under examination and at least one captured further set of diffusion-weighted measurement data MDS2, MSD3 can comprise measurement data from a slice of the object under examination different from the first slice. For example, by means of an EPI technique in an acquisition phase A all measurement data of a slice of the object under examination can be acquired with the corresponding diffusion preparation in the diffusion preparation phase preceding the acquisition phase A.

It is also conceivable, for example, to use a simultaneous multi-slice imaging method (SMS) to capture measurement data simultaneously in a measurement dataset not just of a single slice, but of a slice tuple consisting of multiple slices, so that the first set of diffusion-weighted measurement data (MDS1) can comprise measurement data of a first slice tuple of the object under examination, and at least one captured further set of diffusion-weighted measurement data MDS2, MSD3 can comprise measurement data from a slice tuple of the object under examination different from the first slice tuple.

Figure 3:
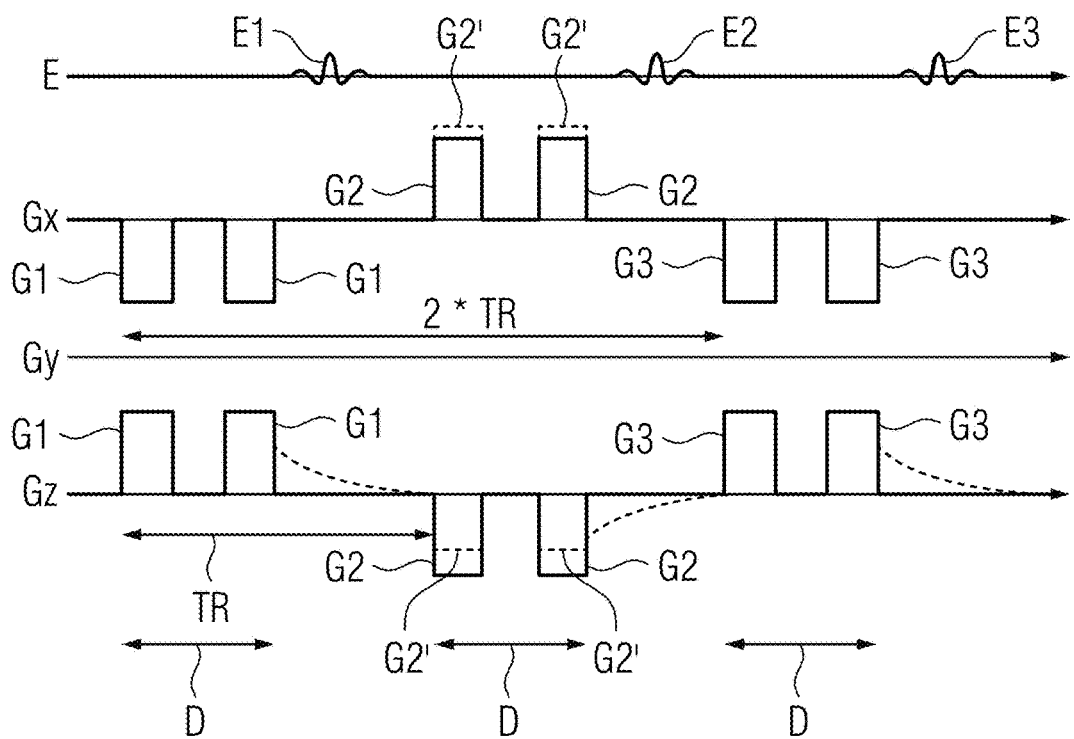
FIG. 3 is plot of a sequence of diffusion preparations for the capture of sets of measurement data, according to an exemplary embodiment of the present disclosure.

FIG. 3, which shows an example of a section of a sequence of diffusion preparation phases D for the inventive capture of sets of measurement data, illustrates the inventive selection of a polarization of diffusion gradients.

For the sake of clarity, the representation in FIG. 3 concentrates on the diffusion preparation phases D. RF pulses to be irradiated are not represented, likewise the respective acquisition phases A, which however as usual coincide with the echo signals E1, E2, E3, . . . to be acquired in each case.

In the example shown only three diffusion preparation phases D are represented, in order to clarify the principle. Realistically, in a given diffusion imaging method significantly more diffusion preparation phases D with an identical diffusion encoding are employed.

In the representation in FIG. 3 diffusion gradients G1 are switched in a first diffusion preparation phase D, and here by way of example generate a diffusion preparation in the standardized spatial direction R=(−1, 0, +1), i.e. diffusion gradients G1 are switched in the gradient directions Gx and Gy. The echo signal E1 diffusion-prepared in this way is acquired as measurement data of a first set of diffusion-weighted measurement data.

In the subsequent diffusion preparation phase D diffusion gradients G2 are switched which inventively have an inverted polarity compared to the diffusion gradients G1. As a result, the diffusion gradients G2 generate a diffusion preparation in the standardized spatial direction R'=(+1, 0, −1), which lies antiparallel to the diffusion direction generated with the diffusion gradients G1. Thus, the diffusion gradients G1 and G2 in each case generate diffusion encodings in the same direction, but with a different orientation. The echo signal E2 diffusion-prepared in this way is acquired as measurement data of a further set (MDS2) of diffusion-weighted measurement data.

In a further subsequent diffusion preparation phase D diffusion gradients G3 are switched, which for example again correspond to the diffusion gradients G1 of the last-but-one diffusion preparation phase D, as a result of which in turn a diffusion encoding is generated in the same direction with once again reversed orientation. The echo signal E3 diffusion-prepared in this way is acquired as measurement data of a further set of diffusion-weighted measurement data (MDS3).

The temporal interval, corresponding to the time of repetition TR, of diffusion gradients to be switched in consecutive diffusion preparation phases D is extended by the inventive inversion of the polarity for polarity-sensitive hardware components to a temporal interval 2*TR, which lies between two consecutive diffusion gradients G1, G3 with the same polarity that are to be switched. Thus, pauses otherwise necessary for hardware components can be prevented or at least reduced. It may be noted that in connection with diffusion imaging it is the case that the temporal duration of a repeated application of an identical diffusion encoding (prior to repetition of a repeated application of a further identical diffusion encoding) is referred to as the time of repetition, here called $TR_D$ to distinguish it. If for example for a number Ns of slices in each case an identical diffusion encoding is performed, then $TR_D$=Ns*TR, with the time of repetition TR as defined here above.

Prior to a capture of sets of diffusion-weighted measurement data (Block 107) the executability of such an optimized sequence of diffusion gradients G1, G2, G3 to be switched in consecutive diffusion preparation phases D and/or where appropriate a remaining minimally necessary duration of pauses can additionally be checked or determined, for example using a method as described in the above-mentioned DE102008015261B4. Furthermore, prior to a capture of sets of diffusion-weighted measurement data (Block 107) a method can additionally also be performed which takes account of a load on hardware components in order to achieve a more uniform load in the longer term, such as multiple TRs. Such methods are for example described in EP3425417A1 and EP3654050A1 as already mentioned.

In all diffusion preparation phases a diffusion encoding in the same direction can be generated. In this case for each desired measurement dataset MDS* an acquisition of a set MDS1, MDS2, MDS3 of identically diffusion-encoded measurement data can take place consecutively, wherein the polarity of the diffusion gradients applied in consecutive diffusion preparation phases alternates.

Sets of diffusion-weighted measurement data MDS1, MDS2, MDS3, . . . can also be captured multiple times with an identical position encoding, for example to enable the captured measurement data to be notified. In this case a polarity of diffusion gradients of the diffusion preparation phases associated with the repeatedly captured sets of diffusion-weighted measurement data MDS1, MDS2, MDS3, . . . can differ at least once, in particular a polarity of diffusion gradients of the diffusion preparation phases associated with the repeatedly captured sets of diffusion-weighted measurement data MDS1, MDS2, MDS3, . . . can be alternately positive and negative, i.e. they can alternate. In this way each desired measurement dataset MDS* is captured with each desired diffusion encoding and with diffusion gradients of each possible polarity. For example, to this end sets of diffusion-weighted measurement data MDSi to be captured can be captured consecutively initially with a positive polarity of the diffusion gradients for sets of diffusion-weighted measurement data with an odd-numbered index (i=1, 3, . . . ) and with a negative polarity of the diffusion gradients for sets of diffusion-weighted measurement data with an even-numbered index (i=2, 4, . . . ), and then also again conversely with a negative polarity of the diffusion gradients for sets of diffusion-weighted measurement data with an odd-numbered index (i=1, 3, . . . ) and with a positive polarity of the diffusion gradients for sets of diffusion-weighted measurement data with an even-numbered index (i=2, 4, . . . ).

Such a procedure is in particular advantageous if further imaging gradients (for example gradients for the slice selection or "crusher" gradients for the suppression of undesired signal portions) switched between an excitation of an echo signal and the acquisition phase in which the echo signal is acquired contribute to the diffusion encoding. In such a case it may be that on inversion of the polarity of the diffusion gradients an effective diffusion direction, which takes account of the contributions of the further imaging gradients and of the diffusion gradients, and for example can be calculated as one trace of the diffusion encoding matrix ("b matrix"), can easily change. If each captured measurement dataset MDS1, MDS2, MDS3, is captured with each diffusion encoding and with each polarity, effects of possibly divergent effective diffusion directions can be prevented, since in each case all sets of diffusion-weighted measurement data MDS1, MDS2, MDS3, . . . are present for each polarization.

It is also possible that in the diffusion preparation phases that are performed diffusion encodings are generated in different directions. This is in particular regularly the case for diffusion tensor imaging (DTI), in which diffusion measurements are acquired in at least six directions.

Acquisitions of diffusion-weighted measurement data of an identical diffusion direction can here take place in consecutive acquisition phases, so that it is possible to proceed as already described above. In this case, after all sets of diffusion-weighted measurement data MDS1, MDS2, MDS3, . . . for a diffusion direction have been captured, further sets of diffusion-weighted measurement data MDS1, MDS2, MDS3, . . . for a further diffusion direction can be captured, until all sets of diffusion-weighted measurement data MDS1, MDS2, MDS3, . . . for all desired diffusion directions have been captured.

However, DTI methods are sensitive to small deviations in the effective diffusion direction, such as those described previously. Hence it may make sense to take account, by a change in the polarization of diffusion gradients, of changes made here to the generated diffusion directions, in order to prevent any errors in the determination of diffusion tensors. Although during a determination of diffusion tensors it is in principle possible to work with diffusion directions specific for each captured set of diffusion-weighted measurement data, in particular slice-specific diffusion directions, this can however lead to inconsistencies when DTI evaluations take place on data of different sets of diffusion-weighted measurement data, in particular of multiple slices, as is the case for example with what is known as "fiber tractography" or with methods of what is known as "tract density imaging" (TDI).

In order therefore to be able to take account of possible changes in an effective diffusion direction due to different polarities of applied diffusion gradients, pairs of maximally similar diffusion directions PR of the diffusion directions R to be applied can be determined in accordance with a similarity measure, when diffusion encodings in different directions are generated in the diffusion preparation phases performed, prior to the acquisition of the measurement data from the loaded diffusion directions R to be applied for the sets of diffusion-weighted measurement data MDS1, MDS2, MDS3, . . . to be captured (Block 103). To this end a number of desired diffusion directions R is advantageously even-numbered, in order to be able to assign all desired diffusion directions R to precisely one pair of similar diffusion directions. Should an odd-numbered number of desired diffusion directions R be specified, it is possible, for a last diffusion direction not assigned to any pair, to proceed as described above with alternating polarity of the associated diffusion gradients in consecutive diffusion preparation phases. Alternatively, a further pair of similar diffusion directions can be determined, in that, for the diffusion direction not yet assigned to a pair, a diffusion direction already assigned to another pair, which is maximally similar to the diffusion direction not yet assigned, is determined. The latter makes sense in particular if sets of diffusion-weighted measurement data are in any case to be captured repeatedly with identical position encoding and diffusion encoding.

The sets of diffusion-weighted measurement data MDS1, MDS2, MDS3, . . . to be captured can now be captured such that in consecutive acquisition phases diffusion-weighted measurement data is acquired alternately in diffusion directions of a particular pair of diffusion directions.

Thus, in consecutive diffusion preparation phases D it is not the case, as described above, that in each case an identical diffusion direction with a different orientation is generated, but in consecutive diffusion preparation phases D in each case an identical diffusion direction with a maximally different orientation is furthermore generated due to the polarization of diffusion gradients inventively changed compared to the previous diffusion encoding.

A generation of a maximally similar diffusion direction R" is illustrated in FIG. 3 by the diffusion gradients G2' represented by dashed lines, which, when switched instead of the diffusion gradients G2 generate a diffusion encoding for example in a diffusion direction R'=($\sqrt{2}$ cos a,0, -$\sqrt{2}$ sin a), where 0°<a<90° is equal to the intermediate angle between the diffusion directions R' and R".

Thus, from a number Nd of desired diffusion directions Nd/2 pairs of maximally similar diffusion directions PR can be found, which in each case are to be generated in consecutive diffusion preparation phases D, wherein the polarity for each of the diffusion directions R of a pair of similar diffusion directions PR is stipulated such that the diffusion directions are maximally antiparallel.

The determination of pairs PR of maximally similar diffusion directions R can include a determination of a scalar product in each case of two of the diffusion directions R to be applied.

For example, in the case of Nd=6 different desired diffusion directions R1, R2, R3, R4, R5, and R6, a first pair PR1 of maximally similar diffusion directions can be determined, in that the scalar product of a first diffusion direction of the desired diffusion directions R, for example of R1, is in each case calculated with the remaining diffusion directions, for example D2, D3, D4, D5 and D6. Two vectors lie in a similar direction when the sum of the scalar product is maximally large. The similarity measure can therefore for example be based on a sum of the scalar products obtained in this way. The similarity measure can in particular be based on a value of the quotient from the sum of a scalar product of two diffusion directions R and the product of the sums of the diffusion directions which corresponds to the cosine of the intermediate angle of both the diffusion directions, for example if the diffusion directions can have different lengths (sums). If a first pair of similar diffusion directions PR is determined in this way, for example oBdA PR1=(R1,R4), an analogous procedure can be used with the remaining diffusion directions (in the example: R2, R3, R5 and R6), until all desired diffusion directions R have been assigned in this way to a pair of similar diffusion directions PR.

For the inventive inversion of the polarities of diffusion gradients switched in consecutive diffusion preparation phases the polarity of the vectors can now be determined for each pair of similar diffusion directions PR=(Rn,Rm). This can likewise be done for example by way of the already calculated scalar product, in that depending on the sign of the scalar product of the diffusion directions Rn and Rm the signs of the diffusion gradients to be switched for the diffusion direction Rm are adjusted. In particular, if a maximally antiparallel alignment of the diffusion directions Rn and Rm of the pair of similar diffusion directions PR is achieved, if the diffusion gradients of the diffusion direction Rm are multiplied by the factor "−4", if the scalar product of Rn with Rm is less than zero (Rn*Rm>0), and in the other case, if the scalar product of Rn with Rm is greater than zero (Rn*Rm<0), the diffusion gradients of the diffusion direction Rm are retained without change, which corresponds to multiplication by the factor "+1".

In short, a desired maximally large antiparallelism of a pair of similar diffusion directions PR=(Rn, Rm) can be achieved by multiplying the diffusion direction Rm by the factor α, which does not change the direction of the diffusion direction Rm, but rather its orientation, so that pairs of similar diffusion directions PR=(Rn, αRm) are obtained, where α=1, if Rn*Rm<0, and α=−1, if Rn*Rm>0.

Thus, within the meaning of the disclosure it is possible to speak about an "identical" (or "similar") polarity if the scalar product Rn*Rm has a positive sign; about an "inverted" (or "maximally inverted") polarity if the scalar product Rn*Rm has a negative sign. An exactly "identical" or "inverted" polarity exists if the sum of the scalar product is identical to the sum of the individual vector lengths: |Rn||Rm|=|Rn*Rm|.

After all desired sets of diffusion-encoded measurement data MDS1, MDS2, MDS3, . . . have been alternately captured encoded with the diffusion directions Rn and αRm thus obtained (so that all sets of diffusion-weighted measurement data with an odd-numbered index MDS1, MDS3, . . . have been captured encoded with Rn, and all sets of diffusion-weighted measurement data MD2, . . . with an even-numbered index have been captured encoded with αRm), in order in each case to capture all desired sets of diffusion-encoded measurement data MDS1, MDS2, MDS3, . . . with all desired diffusion directions R, the desired sets of diffusion-encoded measurement data MDS1, MDS2, MDS3, . . . are further alternately captured encoded with the thus obtained diffusion directions Rn and αRm of the pair of similar diffusion directions PR in a changed order (so that all sets of diffusion-weighted measurement data with an odd-numbered index MDS1, MDS3, . . . are also captured encoded with αRm, and all sets of diffusion-weighted measurement data MD2, . . . with an even-numbered index are captured encoded with Rn).

If the sets of diffusion-weighted measurement data MDS1, MDS2, MDS3, . . . to be captured are captured repeatedly with an identical position encoding, the sets of diffusion-weighted measurement data can, analogously to the case described above, further be captured encoded alternately with the diffusion directions of the pairs of similar diffusion directions PR=(Rn, Rm), wherein during the further capture the desired antiparallelism now takes place by adjusting the signs of the diffusion directions Rn, so that pairs of similar diffusion directions PR=(−αRn, −Rm) are now obtained, where α=1, if Rn*Rm<0, and α=−1, if Rn*Rm>0.

In this way each desired measurement dataset MDS* is captured with each desired diffusion encoding and with diffusion gradients of each possible polarity adjusted by the factor α.

Besides the already discussed inventively achieved reduction of the load on hardware components and the reduction in the overall measurement time achievable therewith, thanks to the polarity, inventively inverted in consecutive diffusion preparation phases, of the respective diffusion gradients a further advantage is produced, since the polarity, alternating on the short time scales here (with TR), of the diffusion gradients also results in a reduction of eddy-current fields induced by the diffusion gradients (with characteristic time constants of the eddy-current effects in the order of magnitude of TR). If after the time of repetition TR itself only small residual eddy-current effects are present, these can, in particular in the case of echoplanar acquisition methods (with an immanently small pixel bandwidth along the phase encoding direction), accumulate in the course of the overall measurement with for example identical diffusion encoding for each set of diffusion-weighted measurement data for a number Ns=10 of different slices, without the inventive polarization of the diffusion gradients, to form considerable eddy-current fields, which can result in significant image distortions.

Such an accumulation is inventively prevented, although the generated diffusion direction in consecutive diffusion preparation phases is the same or maximally similar.

This is illustrated in FIG. 3 by a decrease, indicated by a dotted line, in eddy currents by way of example after the respective last diffusion gradient G1, G2 or G3 in the three diffusion preparation phases D illustrated: although in each case at the start of a subsequent diffusion preparation phase D residual eddy-current fields are still present (the decrease indicated is not yet back to zero), thanks to the inverted polarity of the diffusion gradients of the subsequent diffusion preparation phase D an eddy-current field generated by these diffusion gradients is generated in the opposite direction, so that the eddy-current fields generated in consecutive diffusion preparation phases D at least partially compensate one another, instead of accumulating, as would be the case without inverted polarity of the switched diffusion gradients.

Because a diffusion direction generated in consecutive diffusion preparation phases is the same or maximally similar, further advantageously a geometry of the (residual) eddy-current fields generated by the switched diffusion gradients (and thus a geometry of remaining image distortions) is also generated, which is similar for all sets of diffusion-weighted measurement data MDS1, MDS2, MDS3, . . . (which for example in each case map a slice). Thus, additionally it is also possible to employ image distortion methods, as described for example in DE102010001577B4 or DE102010013605B4, which use information about the geometry of image distortions or information about distortions of adjacent slices, for example during or after a reconstruction of image data BD from the captured sets of measurement data MDS1, MDS2, MDS3, . . . (Block 109).

In the diffusion preparation phases a monopolar diffusion encoding (with excitation and acquisition of spin echoes, as described in the aforementioned article by Stejskal and Tanner) or a bipolar diffusion encoding with a not entirely symmetrical division of the bipolar gradients (for example with excitation and acquisition of twice-refocused spin echoes, as described for example by Reese et al. in "Reduction of Eddy-Current-Induced Distortion in Diffusion MRI Using a Twice-Refocused Spin Echo", Magn. Res. Med. 49:p. 177-182, 2003), or a diffusion encoding of stimulated echoes can take place.

Single diffusion encoding, double diffusion encoding or multiple diffusion encoding can take place in the diffusion preparation phases.

In the acquisition phases A, echo signals can be acquired by means of an echoplanar acquisition technique.

Figure 4:
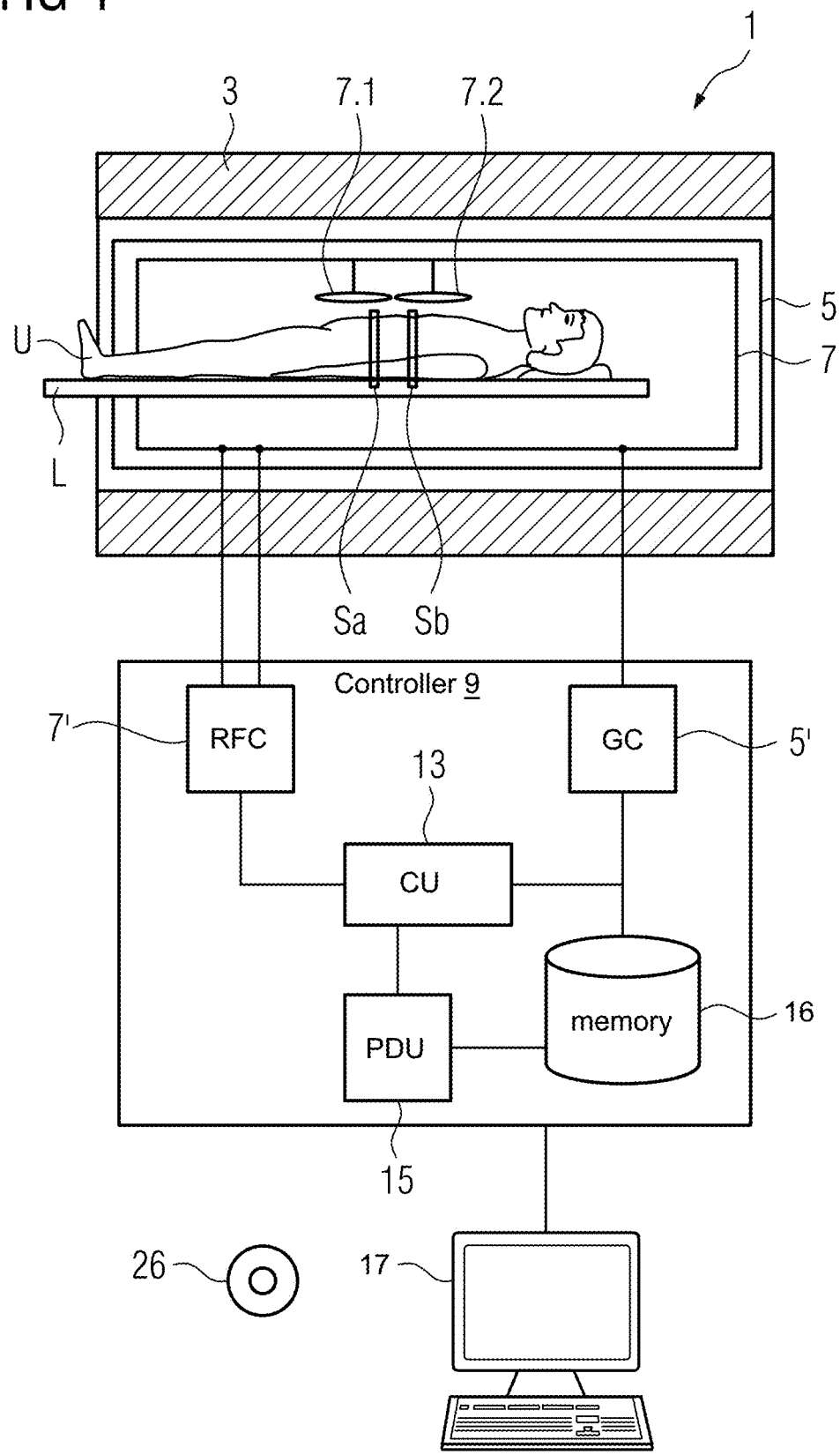
FIG. 4 illustrates a magnetic resonance system according to an exemplary embodiment of the present disclosure.

FIG. 4 schematically represents an inventive magnetic resonance (MR) system 1. This comprises a magnet unit 3 for the generation of the constant magnetic field, a gradient unit 5 for the generation of the gradient fields, a radio-frequency unit 7 for irradiation and for the receipt of radio-frequency signals and a controller 9 designed for the performance of an inventive method. The magnet unit 3, gradient unit 5, and a radio-frequency unit may collectively be referred to as a magnetic resonance (MR) scanner.

FIG. 4 represents these subunits of the magnetic resonance system 1 only roughly schematically. In particular, the radio-frequency unit 7 can consist of multiple subsidiary units, for example multiple coils such as the schematically shown coils 7.1 and 7.2 or more coils, which can be configured either only to transmit radio-frequency signals or only to receive the triggered high-frequency signals or for both.

For the examination of an object under examination U, for example a patient or also a phantom, the latter can be introduced on a couch L into the measurement volume of the magnetic resonance system 1. The slices $S_a$ and $S_b$ represent exemplary target volumes of the object under examination, from which echo signals are to be acquired and captured as measurement data.

In an exemplary embodiment, the controller 9 is configured to control the magnetic resonance system 1 and can in particular control the gradient unit 5 by means of a gradient controller 5' and the radio-frequency unit 7 by means of a radio-frequency transmit/receive controller 7'. The radio-frequency unit 7 can here comprise multiple channels on which signals can be transmitted or received. In an exemplary embodiment, the controller 9 includes processing circuitry configured to perform one or more operations and/or functions of the controller 9. One or more components of the controller 9 may include processing circuitry configured to perform one or more respective operations and/or functions of the component(s).

The radio-frequency unit 7 is responsible, together with its radio-frequency transmit/receive controller 7', for the generation and irradiation (transmission) of a radio-frequency alternating field for manipulation of the spins in a region to be manipulated (for example in slices to be measured S) of the object under examination U. In this case the center frequency of the radio-frequency alternating field, also called a B1 field, is generally maximally set so that it lies close to the resonance frequency of the spins to be manipulated. Deviations from the center frequency by the resonance frequency are referred to as off-resonance. To generate the B1 field currents controlled by means of the radio-frequency transmit/receive controller 7' are applied to the RF coils in the radio-frequency unit 7.

In an exemplary embodiment, the controller 9 further comprises a polarization determination unit (PDU) 15, with which inventive compensation gradients for the compensation of eddy currents can be determined, which can be implemented by the gradient controller 5'. The PDU 15 may also be referred to as a compensation gradient processor. The controller 9 is overall configured to perform an inventive method.

In an exemplary embodiment, a computing unit (computer) 13 comprised in the controller 9 is configured to execute (e.g. using one or more processors) all computing operations needed for the necessary measurements and determinations. Interim results and results needed for this or hereby determined can be stored in a memory unit 16 of the controller 9. In an exemplary embodiment, the computing unit 13 includes processing circuitry configured to perform one or more operations and/or functions of the computing unit 13. The units shown are not necessarily to be understood here as physically separate units, but merely represent a subdivision into meaningful units, which however can also be realized for example in fewer or even in just a single physical unit.

Using an input/output (I/O) device 17 of the magnetic resonance system 1, a user can, for example, send control commands to the magnetic resonance system and/or display results of the controller 9 as image data, for example.

A method described herein can also be present in the form of a computer program product which comprises a program and implements the described method on a controller 9 when it is executed on the controller 9. Likewise, an electronically readable data medium 26 with electronically readable control information stored thereon can be present which comprises at least one such computer program product as just described and is configured such that when the data medium 26 is used in a controller 9 of a magnetic resonance system 1 it performs the described method.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(y) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for the optimized acquisition of diffusion-weighted measurement data of an object under examination using a magnetic resonance (MR) system, the method comprising:
   capturing a first set of diffusion-weighted measurement data by excitation, and, in an acquisition phase, acquisition of at least one position-encoded echo signal, wherein prior to the acquisition phase, diffusion gradients are switched for diffusion encoding of the diffusion-weighted measurement data in a diffusion preparation phase; and
   capturing at least one further set of diffusion-weighted measurement data by excitation, and, in an acquisition phase, acquisition of at least one further position-encoded echo signal, wherein prior to the acquisition phase, diffusion gradients are switched for diffusion encoding of the diffusion-weighted measurement data in the associated diffusion preparation phase,
   wherein diffusion gradients switched in consecutive diffusion preparation phases have an inverted polarity.

2. The method as claimed in claim 1, wherein:
   the first set of diffusion-weighted measurement data comprises measurement data of a first slice of the object under examination and the at least one captured further set of diffusion-weighted measurement data comprises measurement data from a slice of the object under examination different from the first slice; or
   the first set of diffusion-weighted measurement data comprises measurement data of a first slice tuple of the object under examination and the at least one captured further set of diffusion-weighted measurement data comprises measurement data from a slice tuple of the object under examination different from the first slice tuple.

3. The method as claimed in claim 1, wherein a diffusion encoding in an identical direction is generated in all diffusion preparation phases.

4. The method as claimed in claim 1, wherein in the diffusion preparation phases performed, diffusion encodings are generated in different directions, and acquisitions of sets of diffusion-weighted measurement data of an identical diffusion direction take place in consecutive acquisition phases.

5. The method as claimed in claim 1, wherein, in the diffusion preparation phases performed, diffusion encodings are generated in different directions, and, prior to the acquisition of the sets of diffusion-weighted measurement data:
   loading the diffusion directions to be applied for the sets of diffusion-weighted measurement data to be captured,
   determining pairs of maximally similar diffusion directions of the diffusion directions to be applied in accordance with a similarity measure, and
   capturing the sets of diffusion-weighted measurement data to be captured, such that, in consecutive acquisition phases, diffusion-weighted measurement data is acquired alternately in diffusion directions of a particular pair of diffusion directions.

6. The method as claimed in claim 5, wherein the determination of the pairs of maximally similar diffusion directions comprises a determination of a scalar product in each case of two of the diffusion directions to be applied.

7. The method as claimed in claim 6, wherein the similarity measure is based on a sum of the scalar products.

8. The method as claimed in claim 1, wherein measurement datasets of diffusion-weighted measurement data are repeatedly captured with an identical position encoding, a polarity differing at least once from diffusion gradients of the diffusion preparation phases associated with the repeatedly captured measurement datasets.

9. The method as claimed in claim 8, wherein the polarity differs alternatingly from diffusion gradients of the diffusion preparation phases associated with the repeatedly captured measurement datasets.

10. The method as claimed in claim 1, wherein the diffusion preparation phases comprise a monopolar or a bipolar diffusion encoding, or a diffusion encoding of a stimulated echo.

11. The method as claimed in claim 1, wherein the diffusion preparation phases comprise single diffusion encoding, double diffusion encoding, or multiple diffusion encoding.

12. The method as claimed in claim 1, wherein echo signals are acquired in acquisition phases using an echoplanar acquisition technique.

13. A computer program product, embodied on a non-transitory computer-readable storage medium, having a computer program and which is directly loadable into a memory of a computer, when executed by the computer, causes the computer to perform the method as claimed in claim 1.

14. A non-transitory computer-readable storage medium with an executable program stored thereon, that when executed, instructs a processor to perform the method of claim 1.

15. A magnetic resonance (MR) system, comprising:
   a scanner; and
   a controller configured to:
      capture, using the scanner, a first set of diffusion-weighted measurement data by excitation, and, in an acquisition phase, acquisition of at least one position-encoded echo signal, wherein prior to the acquisition phase, diffusion gradients are switched for diffusion encoding of the diffusion-weighted measurement data in a diffusion preparation phase; and capture, using the scanner, at least one further set of diffusion-weighted measurement data by excitation, and, in an acquisition phase, acquisition of at least one further position-encoded echo signal, wherein prior to the acquisition phase, diffusion gradients are switched for diffusion encoding of the diffusion-weighted measurement data in the associated diffusion preparation phase, wherein diffusion gradients switched in consecutive diffusion preparation phases have an inverted polarity.

16. The MR system as claimed in claim 15, wherein a diffusion encoding in an identical direction is generated in all diffusion preparation phases.

17. The MR system as claimed in claim 15, wherein in the diffusion preparation phases performed, diffusion encodings are generated in different directions, and acquisitions of sets of diffusion-weighted measurement data of an identical diffusion direction take place in consecutive acquisition phases.

18. The MR system as claimed in claim 15, wherein, in the diffusion preparation phases performed, diffusion encodings are generated in different directions, and, prior to the acquisition of the sets of diffusion-weighted measurement data:

loading the diffusion directions to be applied for the sets of diffusion-weighted measurement data to be captured, determining pairs of maximally similar diffusion directions of the diffusion directions to be applied in accordance with a similarity measure, and capturing the sets of diffusion-weighted measurement data to be captured, such that, in consecutive acquisition phases, diffusion-weighted measurement data is acquired alternately in diffusion directions of a particular pair of diffusion directions.

19. The MR system as claimed in claim 18, wherein the determination of the pairs of maximally similar diffusion directions comprises a determination of a scalar product in each case of two of the diffusion directions to be applied.

20. The method as claimed in claim 1, wherein performing the diffusion preparation phases comprises: determining pairs of maximally similar diffusion directions of the diffusion directions to be applied in accordance with a similarity measure, the determination of the pairs of maximally similar diffusion directions including determining a scalar product in each case of two of the diffusion directions to be applied.

21. The MR system as claimed in claim 15, wherein:

the first set of diffusion-weighted measurement data comprises measurement data of a first slice of the object under examination and the at least one captured further set of diffusion-weighted measurement data comprises measurement data from a slice of the object under examination different from the first slice; or the first set of diffusion-weighted measurement data comprises measurement data of a first slice tuple of the object under examination and the at least one captured further set of diffusion-weighted measurement data comprises measurement data from a slice tuple of the object under examination different from the first slice tuple.

* * * * *